United States Patent [19]

Rockwood

[11] 4,236,124
[45] Nov. 25, 1980

[54] $CO_2$ OPTICALLY PUMPED DISTRIBUTED FEEDBACK DIODE LASER

[75] Inventor: Stephen D. Rockwood, Los Alamos, N. Mex.

[73] Assignee: The United States of America as represented by the United States Department of Energy, Washington, D.C.

[21] Appl. No.: 957,631

[22] Filed: Nov. 3, 1978

[51] Int. Cl.$^3$ .............................................. H01S 3/094
[52] U.S. Cl. ........................ 331/94.5 H; 331/94.5 C; 331/94.5 P
[58] Field of Search ....................... 331/94.5 P, 94.5 C, 331/94.5 H

[56] References Cited

U.S. PATENT DOCUMENTS 3,760,292   9/1973   Kogelnik et al. ................ 331/94.5 C
3,906,393   9/1975   Fletcher .......................... 331/94.5 C

OTHER PUBLICATIONS

Mooradian et al., Broad-Band Laser Emission from Optically Pumped $PbS_{1-x}Se_x$, IEEE J. Quant. Electr., vol. QE-9, No. 2, (Feb. 1973), pp. 347–349.

Chandra et al., Prism-Dye Laser, Appl. Phys. Lett., vol. 21, No. 4, (Aug. 15, 1972), pp. 144–146.

*Primary Examiner*—William L. Sikes
*Attorney, Agent, or Firm*—James E. Denny; Richard G. Besha; William W. Cochran

[57] ABSTRACT

A diode laser optically pumped by a $CO_2$ coherent source. Interference fringes generated by feeding the optical pumping beam against a second beam, periodically alter the reflectivity of the diode medium allowing frequency variation of the output signal by varying the impingent angle of the $CO_2$ laser beams.

3 Claims, 2 Drawing Figures

$CO_2$ OPTICALLY PUMPED DISTRIBUTED FEEDBACK DIODE LASER

BACKGROUND OF THE INVENTION

The present invention pertains generally to lasers and more particularly to frequency control of diode lasers.

A major disadvantage of the diode laser has been the inability to achieve good mode control within the diode lasing medium. Various distributed feedback systems have been used in the prior art to alter the reflectivity of the medium in a periodic fashion to achieve good mode control. Typically semiconductor lasers, such as diode lasers, are mechanically etched or ruled in a direction perpendicular to the lasing axis. This procedure is time consuming and expensive, and generally constitutes a poor manner of achieving mode control. Moreover, the mode of operation of the diode laser is fixed once this technique of mechanical etching or ruling has been performed.

Another disadvantage of the diode laser has been its relatively low output powers. Typically, DC currents are utilized to pump the diode laser to initiate lasing. Alternatively, optical pumping of semiconducting diode lasers has been performed such as disclosed in IEEE Journal of Quantum Electronics, 9, 347 (1973). However, no method has been disclosed for varying the reflectivity of a diode medium in a periodic fashion to vary the output frequency.

SUMMARY OF THE INVENTION

The present invention overcomes the disadvantages and limitations of the prior art by providing a $CO_2$ optically pumped distributed feedback diode laser. According to the present invention, the reflectivity of the diode medium is altered in a periodic fashion by generating interference fringes between a $CO_2$ optical pumping beam and a second beam impinging upon the diode lasing medium. By varying the impingent angle between the $CO_2$ beams on the diode lasing medium, the period of interference fringes is changed to alter the output frequency of the diode laser.

To achieve the foregoing and in accordance with the purposes of the present invention, as embodied and broadly described herein, the optically pumped distributed feedback diode laser may comprise, a diode laser medium, $CO_2$ laser means for generating a first $CO_2$ laser beam, means for splitting said $CO_2$ laser beam into a second $CO_2$ laser beam directed at said diode laser at a first predetermined angle and a third $CO_2$ laser beam, means for reflecting said third $CO_2$ laser beam to direct said third $CO_2$ laser beam at said diode laser medium at a second predetermined angle to generate interference fringes within said diode laser medium to periodically alter the reflectivity and optically pump said diode laser medium to initiate lasing action.

The present invention may also comprise, in accordance with its objects and purposes, an optically pumped distributed feedback tunable diode laser comprising, a diode laser medium, optical pumping means for generating a first coherent laser beam and a second coherent laser beam, means for directing said first coherent laser beam to impinge upon said diode lasing medium at a predetermined location at a first predetermined angle, means for directing said second coherent laser beam to impinge upon said diode lasing medium at said predetermined locaton at a second predetermined angle so as to generate interference fringes in said diode laser medium to periodically alter reflectivity of said diode laser medium and simultaneously optically pump said diode laser medium to cause lasing, and, means for varying said first and second predetermined angles to vary the output frequency ($\lambda$) of said diode laser.

It is therefore an object of the present invention to provide a $CO_2$ optically pumped distributed feedback diode laser.

It is also an object of the present invention to provide an easily tunable $CO_2$ optically pumped distributed feedback diode laser.

Another object of the present invention is to provide a $CO_2$ optically pumped distributed feedback diode laser with high output power.

Other objects and further scope of applicability of the present invention will become apparent from the detailed description given hereinafter. The detailed description, indicating the preferred embodiments of the invention, is given only by way of illustration since various changes and modifications within the spirit and scope of the invention will become apparent to those skilled in the art from this detailed description. The foregoing Abstract of the Disclosure is for the purpose of providing a nonlegal brief statement to serve as a searching and scanning tool for scientists, engineers and researchers and is not intended to limit the scope of the invention as disclosed herein nor is it intended to be used in interpreting or in any way limiting the scope or fair meaning of the appended claims.

DETAILED DESCRIPTION OF THE PREFERRED EMBODIMENT OF THE INVENTION

Figures 1, 2:
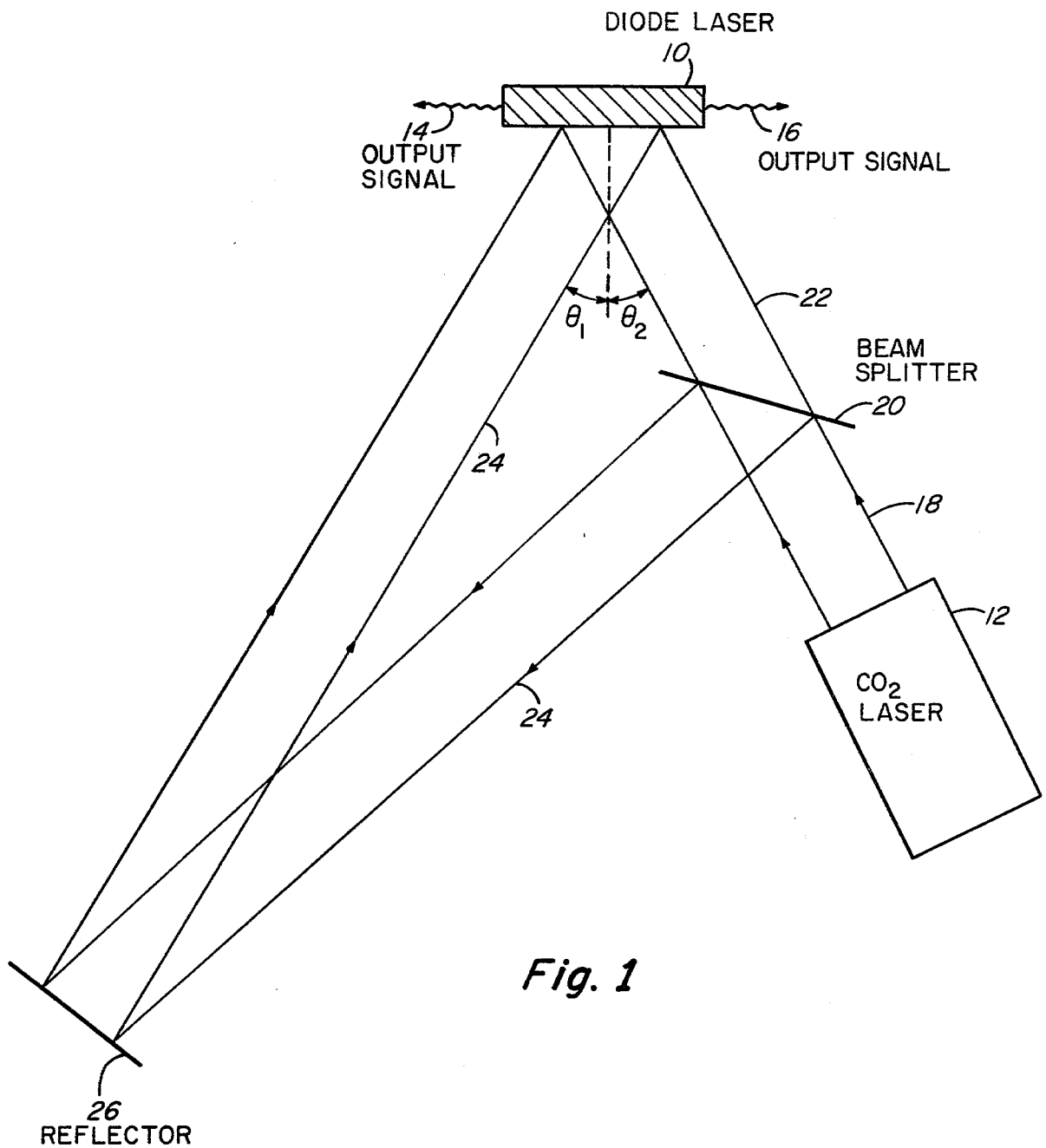
FIG. 1 is a schematic illustration of the arrangement of the preferred embodiment of the invention.
FIG. 2 is a graph illustrating optically pumped gain versus distance along the horizontal axis of the diode.

FIG. 1 schematically illustrates an optically pumped diode laser 10 employing the distributed feedback system of the preferred embodiment of the invention. The $CO_2$ laser beam 18 generated by $CO_2$ laser 12 is split by beam splitter 20 into beams 22 and 24. Beam 24 is reflected by reflector 26 and impinges upon diode laser 10 at a predetermined angle $\theta_1$. Likewise, beam 22 continues along the line of beam 18 and impinges upon the diode laser 10 at an angle $\theta_2$ which is equal to angle $\theta_1$. Beams 22 and 24 create interference patterns and beat against one another to periodically alter the diode lasing medium gain of diode laser 10. The beat frequency generated by the interfering beams 22 and 24 is graphically shown in FIG. 2. This standing wave pattern alters the reflectivity of the diode lasing medium while simultaneously functioning to optically pump the diode laser 10. Since the angle of interference of the two beams controls the period of the interference pattern generated within the diode laser 10, the wavelength of output signals 14 and 16, which is also dependent on the period of reflectivity of the standing wave pattern, is controlled by the angle of incidence of the beams. Lasing of the diode occurs at a wavelength:

$$\lambda = 2n_s \cdot S$$

where
$$S = \lambda_p / 2 \sin \theta$$

which is the separation of the intensity maxima created by the optical pump, and, $n_s =$ to the index of refraction of the diode.

FIG. 2 illustrates the sharply defined fringes which are created within the diode lasing medium of diode laser 10. Since the $CO_2$ has a long coherence length, these interference fringes which generate periodic reflectivity within the diode laser are sharply defined resulting in narrow frequency output and well defined mode of the diode laser signals 14 and 16.

The present invention therefore provides a $CO_2$ optically pumped distributed feedback diode laser which is easily tunable and can be scaled to high average output power. Periodicity of the diode laser medium is achieved by interference fringes from a standing wave pattern generated within the diode lasing medium. The long coherence lengths of the $CO_2$ laser generates well defined interference fringes resulting in narrow frequency output and well defined mode not previously obtainable.

Obviously, many modifications and variations of the present invention are possible in light of the above teachings. It is therefore to be understood within the scope of the appended claims, the invention may be practiced otherwise than as specifically described.

What is claimed is:

1. An optically pumped distributed feedback diode laser comprising:
   a diode laser medium;
   $CO_2$ laser means for generating a first $CO_2$ laser beam;
   means for splitting said first $CO_2$ laser beam into a second $CO_2$ laser beam directed at said diode laser at a first predetermined angle and a third $CO_2$ laser beam;
   means for reflecting said third $CO_2$ laser beam to direct said third $CO_2$ laser beam at said diode laser medium at a second predetermined angle to generate interference fringes within said diode laser medium to periodically alter the reflectivity and optically pump said diode laser medium to initiate lasing action.

2. The diode laser of claim 1 further comprising means for varying said first and second predetermined angles to vary the frequency of said diode laser.

3. An optically pumped distributed feedback tunable diode laser comprising:
   a diode laser medium;
   optical pumping means for generating a first coherent laser beam and a second coherent laser beam;
   means for directing said first coherent laser beam to impinge upon said diode laser medium at a predetermined location at a first predetermined angle;
   means for directing said second coherent laser beam to impinge upon said diode laser medium at said predetermined location at a second predetermined angle so as to generate interference fringes in said diode laser medium to periodically alter reflectivity of said diode laser medium and simultaneously optically pump said diode laser medium to cause lasing;
   means for varying said first and second predetermined angles to vary the output frequency ($\lambda$) of said diode laser.

* * * * *